(12) United States Patent
Luo et al.

(10) Patent No.: US 9,343,128 B2
(45) Date of Patent: May 17, 2016

(54) MAGNETORESISTIVE DEVICE

(75) Inventors: Yuanhong Luo, Singapore (SG); Rachid Sbiaa, Singapore (SG); Yan Hwee Sunny Lua, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 421 days.

(21) Appl. No.: 13/473,917

(22) Filed: May 17, 2012

(65) Prior Publication Data
US 2012/0292723 A1   Nov. 22, 2012

Related U.S. Application Data

(60) Provisional application No. 61/488,183, filed on May 20, 2011.

(51) Int. Cl.
*G11C 11/16* (2006.01)
*H01L 43/08* (2006.01)

(52) U.S. Cl.
CPC ............... *G11C 11/16* (2013.01); *H01L 43/08* (2013.01)

(58) Field of Classification Search
CPC .......... G11C 14/0036; G11C 14/0081; H01L 27/222
USPC ................... 257/421, 427; 365/158, 171, 173
See application file for complete search history.

(56) References Cited

U.S. PATENT DOCUMENTS

| | | | |
|---|---|---|---|
| 6,980,469 B2 * | 12/2005 | Kent et al. | 365/158 |
| 7,602,591 B2 * | 10/2009 | Sbiaa et al. | 360/324.12 |
| 7,616,412 B2 * | 11/2009 | Zhu et al. | 360/324.2 |
| 7,889,543 B2 * | 2/2011 | Morise et al. | 365/158 |
| 8,014,193 B2 * | 9/2011 | Nakayama et al. | 365/158 |
| 8,054,677 B2 * | 11/2011 | Zhu | 365/158 |
| 8,274,811 B2 * | 9/2012 | Zhang et al. | 365/145 |
| 2008/0019040 A1 * | 1/2008 | Zhu et al. | 360/110 |
| 2009/0213638 A1 * | 8/2009 | Morise et al. | 365/145 |
| 2012/0241827 A1 * | 9/2012 | Daibou et al. | 257/295 |

OTHER PUBLICATIONS

Song, "A Spin-Torque Transfer MRAM in 90NM CMOS." 2011.*
Driskill-Smith et al. "STT-RAM—A New Spin on Universal Memory." Jul. 9, 2007. Future Fab Intl. Issue 23. pp. 28-32.*

* cited by examiner

*Primary Examiner* — Mohammad Islam
*Assistant Examiner* — Mikka Liu
(74) *Attorney, Agent, or Firm* — K. David Crockett, Esq.; Niky Economy Syrengelas, Esq.; Crockett & Crockett, PC

(57) ABSTRACT

A magnetoresistive device having a magnetic junction including a first fixed magnetic layer structure, a second fixed magnetic layer structure, and a free magnetic layer structure, wherein the first, second and third fixed magnetic layer structures are arranged one over the other, have respective magnetization orientations configured to orient in a direction at least substantially perpendicular to a plane, wherein the respective magnetization orientations of the first fixed magnetic layer structure and the second fixed magnetic layer structure are oriented in opposite directions, and wherein the magnetization orientation of the first fixed magnetic layer structure is configured to oscillate in a first direction in response to a current or a voltage applied across the magnetic junction so as to change the magnetization orientation of the free magnetic layer structure.

18 Claims, 9 Drawing Sheets

MAGNETORESISTIVE DEVICE

This application claims the benefit of priority of U.S. provisional application No. 61/488,183, filed 20 May 2011, the content of it being hereby incorporated by reference in its entirety for all purposes.

FIELD OF THE INVENTIONS

Various embodiments relate to a magnetoresistive device.

BACKGROUND OF THE INVENTIONS

For magnetoresistive random access memory (MRAM) devices, one of the major problems is the asymmetry of the current used between the switching from the parallel state (P) to the anti-parallel (AP) state (denoted as P→AP), and the switching from the anti-parallel (AP) state to the parallel state (P) state (denoted as AP→P). Asymmetry of the current complicates the device circuitry due to the need for two distinct currents, and the device cell size is limited by the higher of the two currents used during switching.

Another major area of research is reducing the writing current in MRAM devices. Even though the cell size can be made smaller, the high writing current requires a relatively large transistor and thus storage density cannot be improved.

Therefore, there is a need to provide a MRAM device having a magnetic memory element that is capable of higher storage density that addresses the issues of current asymmetry and high writing current.

SUMMARY

According to an embodiment, a magnetoresistive device having a magnetic junction is provided. The magnetic junction of the magnetoresistive device may include a first fixed magnetic layer structure having a fixed magnetization orientation, a second fixed magnetic layer structure having a fixed magnetization orientation, and a free magnetic layer structure having a variable magnetization orientation, wherein the first fixed magnetic layer structure, the second fixed magnetic layer structure and the free magnetic layer structure are arranged one over the other, wherein the first fixed magnetic layer structure, the second fixed magnetic layer structure and the free magnetic layer structure have respective magnetization orientations configured to orient in a direction at least substantially perpendicular to a plane defined by an interface between the first fixed magnetic layer structure and the second fixed magnetic layer structure, wherein the respective magnetization orientations of the first fixed magnetic layer structure and the second fixed magnetic layer structure are oriented in opposite directions, and wherein the magnetization orientation of the first fixed magnetic layer structure is configured to oscillate in a first direction in response to a current or a voltage applied across the magnetic junction so as to change the magnetization orientation of the free magnetic layer structure.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 1A shows a schematic block diagram of a magnetoresistive device having a magnetic junction, while

DETAILED DESCRIPTION OF THE INVENTIONS

Figure 1A:
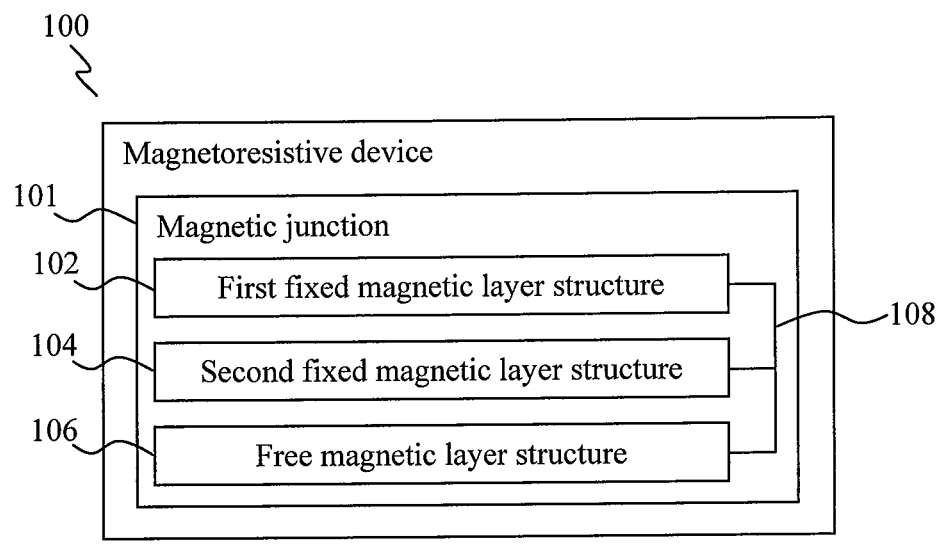

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments.

Embodiments described in the context of one of the devices may be analogously valid for the other device.

In the context of various embodiments, the phrase "at least substantially" may include "exactly" and a variance of +/−5% thereof. As an example and not limitations, "A is at least substantially same as B" may encompass embodiments where A is exactly the same as B, or where A may be within a variance of +/−5%, for example of a value, of B, or vice versa.

In the context of various embodiments, the term "about" as applied to a numeric value encompasses the exact value and a variance of +/−5% of the value.

As used herein, the term "and/or" includes any and all combinations of one or more of the associated listed items.

Various embodiments may relate to a non-volatile magnetic memory device, for example a spin transfer torque magnetoresistive random access memory (STT-MRAM) device. Various embodiments may provide switching magnetization by spin transfer torque (STT) effect in perpendicular anisotropy pseudo spin valves or tunnel junctions magnetoresistive devices.

Various embodiments may provide spin torque magnetoresistive random access memory (MRAM) with low switching current and reduced asymmetry, for example reduced current asymmetry, via frequency-induced spin torque switching (FISTS).

Various embodiments may provide magnetoresistive random access memory (MRAM) devices having a reduction of asymmetry of the current used between switching from the parallel state (P) to the anti-parallel (AP) state (P→AP), and switching from the anti-parallel (AP) state to the parallel state (P) state (AP→P), which may lead to smaller devices that have a simpler circuitry and may be more easily manufactured.

The magnetoresistive device of various embodiments may also be compatible with an application of a voltage bias/pulses across the device, utilizing the electric field effect, which may alter the magnetic properties of the magnetic layers of the magnetoresistive device. In various embodiments, the application of the voltage bias/pulses on the devices is the same or equivalent to using a writing current. Where a current is applied to the magnetoresistive device, a voltage is present across the device as the device has a certain resistance value. This voltage is the source of an electrical field which may help to assist the switching of the free magnetic layer structure or soft magnetic layer magnetization. The electrical field for assisting the switching of free magnetic layer structure magnetization exists or is present when there is an applied voltage or current.

Figure 1B:
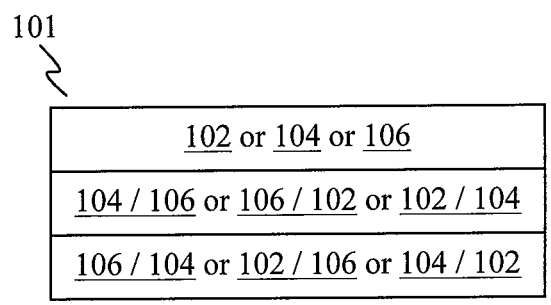
FIG. 1B shows a simplified cross-sectional representation of the magnetic junction of the magnetoresistive device of the embodiment of FIG. 1A, according to various embodiments.

FIG. 1A shows a schematic block diagram of a magnetoresistive device 100 having a magnetic junction 101, while FIG. 1B shows a simplified cross-sectional representation of the magnetic junction 101 of the magnetoresistive device 100 of the embodiment of FIG. 1A, according to various embodiments. The magnetic junction 101 includes a first fixed magnetic layer structure 102 having a fixed magnetization orientation, a second fixed magnetic layer structure 104 having a fixed magnetization orientation, and a free magnetic layer structure 106 having a variable magnetization orientation, wherein the first fixed magnetic layer structure 102, the second fixed magnetic layer structure 104 and the free magnetic layer structure 106 are arranged one over the other, wherein the first fixed magnetic layer structure 102, the second fixed magnetic layer structure 104 and the free magnetic layer structure 106 have respective magnetization orientations configured to orient in a direction at least substantially perpendicular to a plane defined by an interface between the first fixed magnetic layer structure 102 and the second fixed magnetic layer structure 104, wherein the respective magnetization orientations of the first fixed magnetic layer structure 102 and the second fixed magnetic layer structure 104 are oriented in opposite directions, and wherein the magnetization orientation of the first fixed magnetic layer structure 102 is configured to oscillate or process in a first direction in response to a current or a voltage applied across the magnetic junction 101 so as to change the magnetization orientation of the free magnetic layer structure 106. In various embodiments, the first direction may be a circular direction or resembling a cone direction. In FIG. 1A, the line represented as 108 is illustrated to show the relationship between the different components, which may include electrical coupling and/or mechanical coupling.

As shown in FIG. 1B, the first fixed magnetic layer structure 102, the second fixed magnetic layer structure 104 and the free magnetic layer structure 106 may be arranged one over the other. For example, the first fixed magnetic layer structure 102 may be arranged as the top layer of the magnetic junction 101, with the intermediate layer being the second fixed magnetic layer structure 104 and the bottom layer being the free magnetic layer structure 106, or the intermediate layer being the free magnetic layer structure 106 and the bottom layer being the second fixed magnetic layer structure 104.

In embodiments where the second fixed magnetic layer structure 104 is arranged as the top layer of the magnetic junction 101, the intermediate layer may be the free magnetic layer structure 106 with the bottom layer being the first fixed magnetic layer structure 102, or the intermediate layer may be the first fixed magnetic layer structure 102 with the bottom layer being the free magnetic layer structure 106.

In embodiments where the free magnetic layer structure 106 is arranged as the top layer of the magnetic junction 101, the intermediate layer may be the first fixed magnetic layer structure 102 with the bottom layer being the second fixed magnetic layer structure 104, or the intermediate layer may be the second fixed magnetic layer structure 104 with the bottom layer being the first fixed magnetic layer structure 102.

In various embodiments, the free magnetic layer structure 106 may be arranged between the first fixed magnetic layer structure 102 and the second fixed magnetic layer structure 104.

In various embodiments, the second fixed magnetic layer structure 104 may be a static fixed magnetic layer structure, in other words the magnetization orientation of the second fixed magnetic layer structure 104 may be fixed or pinned in one direction. In further embodiments, the magnetization orientation of the second fixed magnetic layer structure 104 may be configured to oscillate or precess in a second direction in response to a current or a voltage applied across the magnetic junction 101 so as to change the magnetization orientation of the free magnetic layer structure 106, the second direction being opposite to the first direction. In various embodiments, the second direction may be a circular direction or resembling a cone direction. As an example, the first direction may be a clockwise direction while the second direction may be an anti-clockwise direction.

In various embodiments, a respective spacer layer may be provided between respective adjacent layers of the first fixed magnetic layer structure 102, the second fixed magnetic layer structure 104 and the free magnetic layer structure 106. As a non-limiting example where the free magnetic layer structure 106 is sandwiched between the first fixed magnetic layer structure 102 and the second fixed magnetic layer structure 104, a spacer layer (e.g. of a conductive and non-magnetic material, or a non-conductive and non-magnetic material) may be provided between the first fixed magnetic layer structure 102 and the free magnetic layer structure 106 and another spacer layer (e.g. of a non-conductive and non-magnetic material) may be provided between the free magnetic layer structure 106 and the second fixed magnetic layer structure 104. In further embodiments, the two respective spacer layers may be of a conductive and non-magnetic material.

In various embodiments, the spacer layer having a conductive and non-magnetic material may include but not limited to copper (Cu), silver (Ag), or gold (Au).

In various embodiments, the spacer layer having a non-conductive and non-magnetic material (e.g. an insulator) may include but not limited to magnesium oxide (MgO), alumina ($AlO_x$) and titanium oxide ($TiO_x$).

In various embodiments, the first fixed magnetic layer structure 102 includes a ferromagnetic layer and a ferromagnetic hard layer arranged one over the other, wherein the ferromagnetic layer has a magnetization orientation configured to orient in a direction at least substantially perpendicular to a plane defined by an interface between the ferromagnetic layer and the ferromagnetic hard layer, and wherein the ferromagnetic hard layer has a magnetization orientation configured to orient in a direction at least substantially parallel to the plane defined by the interface between the ferromagnetic layer and the ferromagnetic hard layer. As an example, the ferromagnetic layer may be arranged on top of the ferromagnetic hard layer. The magnetization orientation of the ferromagnetic layer may be configured to oscillate or precess in the first direction in response to a current or a voltage applied across the magnetic junction 101.

The ferromagnetic layer may include at least one of iron (Fe), cobalt (Co) or nickel (Ni). In various embodiments, the ferromagnetic layer may include cobalt-iron-boron (CoFeB) or a bilayer structure comprising a first layer of material selected from the group consisting of cobalt (Co), cobalt-iron (CoFe) and cobalt-iron-boron (CoFeB), and a second layer of material selected from the group consisting of palladium (Pd), platinum (Pt) and a combination thereof. For example, the ferromagnetic layer may include a bilayer or a multilayer of (Co/X), (CoFe/X) or (CoFeB/X) where X is palladium (Pd), platinum (Pt) or a combination of Pd and Pt. In various embodiments, any combination of cobalt-iron-boron (CoFeB), (Co/X) multilayer, (CoFe/X) multilayer and (CoFeB/X) multilayer may also be provided.

The ferromagnetic hard layer may include a material selected from the group consisting of cobalt (Co), cobalt-iron (CoFe), cobalt-iron-boron (CoFeB) and any combinations thereof.

The first fixed magnetic layer structure 102 may further include a spacer layer between the ferromagnetic layer and the ferromagnetic hard layer. The spacer layer may include or may be a conductive and non-magnetic material, including but not limited to copper (Cu) or silver (Ag) or gold (Au).

In various embodiments, the ferromagnetic hard layer may be or may include a synthetic antiferromagnetic layer (SAF). The synthetic antiferromagnetic layer may include two antiferromagnetically coupled ferromagnetic layers pinned by an antiferromagnetic layer. A metal spacer layer, for example a conductive and non-magnetic spacer layer (e.g. ruthenium (Ru)) may be sandwiched in between the two antiferromagnetically coupled ferromagnetic layers. As a non-limiting example, the synthetic antiferromagnetic layer may have a structure or arrangement having two ferromagnetic layers, with a metal spacer layer having Ruderman-Kittel-Kasuya-Yosida (RKKY) coupling, such as but not limited to ruthenium (Ru), sandwiched in between the two ferromagnetic layers. One of the ferromagnetic layers may be a reference layer while the other ferromagnetic layer is a pinned layer, and in contact with an antiferromagnetic layer (e.g. including a material including X-manganese or X-Y-manganese, wherein each of X and Y is selected from the group consisting of platinum (Pt), palladium (Pd), iridium (Ir), rhodium (Rh) and ruthenium (Ru)). By employing the metal spacer layer with an appropriate thickness, for example about 5 nm or less, for example between about 1 nm and about 5 nm, e.g. between about 1 nm and about 3 nm or between about 3 nm and about 5 nm, the magnetization orientations of the two ferromagnetic layers may be anti-aligned (i.e. the layers are antiferromagnetically coupled). It should be appreciated that the appropriate thickness may be different for different metals. The type of coupling (e.g. anti-aligned or aligned) between the magnetization orientations of the two ferromagnetic layers may oscillate as a function of the metal spacer layer thickness. In various embodiments, the SAF may pin the reference layer and may reduce stray magnetic field that may act on the free magnetic layer structure 106.

In various embodiments, the first fixed magnetic layer structure 102 may further include an antiferromagnetic layer arranged adjacent to the ferromagnetic hard layer. The antiferromagnetic layer may include a material including X-manganese or X-Y-manganese, wherein each of X and Y is selected from the group consisting of platinum (Pt), palladium (Pd), iridium (Ir), rhodium (Rh) and ruthenium (Ru).

In further embodiments, the first fixed magnetic layer structure 102 includes a first ferromagnetic layer, a second ferromagnetic layer, and a ferromagnetic hard layer, wherein the first ferromagnetic layer, the second ferromagnetic layer and the ferromagnetic hard layer are arranged one over the other, wherein the first ferromagnetic layer and the ferromagnetic hard layer have respective magnetization orientations configured to orient in a direction at least substantially perpendicular to a plane defined by an interface between the first ferromagnetic layer and the second ferromagnetic layer, and wherein the second ferromagnetic layer has a magnetization orientation configured to orient in a direction at least substantially parallel to the plane defined by the interface between the first ferromagnetic layer and the second ferromagnetic layer.

In various embodiments, the magnetization orientation of the first ferromagnetic layer may be configured to oscillate or precess in the first direction in response to a current or a voltage applied across the magnetic junction 101. The magnetization orientation of the second ferromagnetic layer may be configured to oscillate or precess in the first direction or a direction opposite to the first direction, in response to the current or the voltage applied across the magnetic junction 101.

In various embodiments, the second ferromagnetic layer may be arranged between the first magnetic layer and the ferromagnetic hard layer. In various embodiments, the ferromagnetic hard layer may be arranged beneath the first ferromagnetic layer and the second ferromagnetic layer. As an example, the first ferromagnetic layer may be arranged on top of or over the second ferromagnetic layer, which in turn may be arranged on top of or over the ferromagnetic hard layer.

The first ferromagnetic layer may include a material selected from the group consisting of cobalt (Co), cobalt-iron (CoFe), cobalt-iron-boron (CoFeB) and any combinations thereof.

The second ferromagnetic layer may include a material selected from the group consisting of cobalt (Co), cobalt-iron (CoFe), cobalt-iron-boron (CoFeB) and any combinations thereof.

The ferromagnetic hard layer may include at least one of iron (Fe), cobalt (Co) or nickel (Ni). In various embodiments, the ferromagnetic hard layer may include cobalt-iron-boron (CoFeB) or a bilayer structure comprising a first layer of material selected from the group consisting of cobalt (Co), cobalt-iron (CoFe) and cobalt-iron-boron (CoFeB), and a second layer of material selected from the group consisting of palladium (Pd), platinum (Pt) and a combination thereof. For example, the ferromagnetic hard layer may include a bilayer or a multilayer of (Co/X), (CoFe/X) or (CoFeB/X) where X is palladium (Pd), platinum (Pt) or a combination of Pd and Pt. Any combination of cobalt-iron-boron (CoFeB), (Co/X) multilayer, (CoFe/X) multilayer and (CoFeB/X) multilayer may also be provided.

In various embodiments, the first fixed magnetic layer structure 102 may further include a first spacer layer between the first ferromagnetic layer and the second ferromagnetic layer, and a second spacer layer between the second ferromagnetic layer and the ferromagnetic hard layer. Each of the first spacer layer and the second spacer layer may include or may be a conductive and non-magnetic material, including but not limited to copper (Cu) or silver (Ag) or gold (Au). Each of the first spacer layer and the second spacer layer may have a thickness of at least 1.5 nm, for example a thickness of between about 1.5 nm and 20 nm, e.g. between about 1.5 nm and 10 nm, between about 1.5 nm and 5 nm, between about 5 nm and 20 nm or between about 5 nm and 10 nm.

In various embodiments, the first fixed magnetic layer structure 102 may further include an antiferromagnetic layer arranged adjacent to the ferromagnetic hard layer. The antiferromagnetic layer may include a material including X-manganese or X-Y-manganese, wherein each of X and Y is selected from the group consisting of platinum (Pt), palladium (Pd), iridium (Ir), rhodium (Rh) and ruthenium (Ru).

In the context of various embodiments, the free magnetic layer structure 106 may include at least one of iron (Fe), cobalt (Co) or nickel (Ni). In various embodiments, the free magnetic layer structure 106 may include cobalt-iron-boron (CoFeB) or a bilayer structure including a first layer of material selected from the group consisting of cobalt (Co), cobalt-iron (CoFe) and cobalt-iron-boron (CoFeB), and a second layer of material selected from the group consisting of palladium (Pd), platinum (Pt) and a combination thereof. For example, the free magnetic layer structure 106 may include a bilayer or a multilayer of (Co/X), (CoFe/X) or (CoFeB/X) where X is palladium (Pd), platinum (Pt) or a combination of Pd and Pt. Any combination of cobalt-iron-boron (CoFeB), (Co/X) multilayer, (CoFe/X) multilayer and (CoFeB/X) multilayer may also be provided.

In the context of various embodiments, the second fixed magnetic layer structure 104 may include at least one of iron (Fe), cobalt (Co) or nickel (Ni). In various embodiments, the second fixed magnetic layer structure 104 may include cobalt-iron-boron (CoFeB) or a bilayer structure including a first layer of material selected from the group consisting of cobalt (Co), cobalt-iron (CoFe) and cobalt-iron-boron (CoFeB), and a second layer of material selected from the group consisting of palladium (Pd), platinum (Pt) and a combination thereof. For example, the second fixed magnetic layer structure 104 may include a bilayer or a multilayer of (Co/X), (CoFe/X) or (CoFeB/X) where X is palladium (Pd), platinum (Pt) or a combination of Pd and Pt. Any combination of cobalt-iron-boron (CoFeB), (Co/X) multilayer, (CoFe/X) multilayer and (CoFeB/X) multilayer may also be provided.

In the context of various embodiments, the term "fixed magnetic layer structure" may mean a magnetic layer structure having a fixed magnetization orientation. The fixed magnetic layer structure may include a hard magnetic or ferromagnetic material. The hard magnetic or ferromagnetic material may be resistant to magnetization and demagnetization (i.e. not easily magnetized and demagnetized), and may have a high hysteresis loss and a high coercivity. In the context of various embodiments, a fixed magnetic layer structure may be referred to as a hard layer or a ferromagnetically hard layer.

In the context of various embodiments, the term "free magnetic layer structure" may mean a magnetic layer structure having a varying or variable magnetization orientation. In other words, the magnetization orientation may be changed or varied, for example by applying a current, such as a spin-polarized current. The free magnetic layer structure may include a soft magnetic or ferromagnetic material. The soft magnetic or ferromagnetic material may be receptive to magnetization and demagnetization (i.e. easily magnetized and demagnetized), and may have a small hysteresis loss and a low coercivity. In the context of various embodiments, a free magnetic layer structure may be referred to as a soft layer or a ferromagnetically soft layer.

Various embodiments may provide a magnetoresistive device. The magnetoresistive device may be a giant magnetoresistive (GMR) device or a tunnel magnetoresistive (TMR) device with a current flowing perpendicular to the plane (CPP) direction. The magnetoresistive device of various embodiments may include a ferromagnetically hard layer (e.g. a static ferromagnetically hard layer) which may function as a reference layer, a ferromagnetically soft layer which may function as a storage layer and an "effective" ferromagnetic layer (e.g. an oscillating layer or an oscillating ferromagnetic layer) that oscillates or processes when a writing current or a voltage is applied through or across the magnetoresistive device.

Figure 2A:
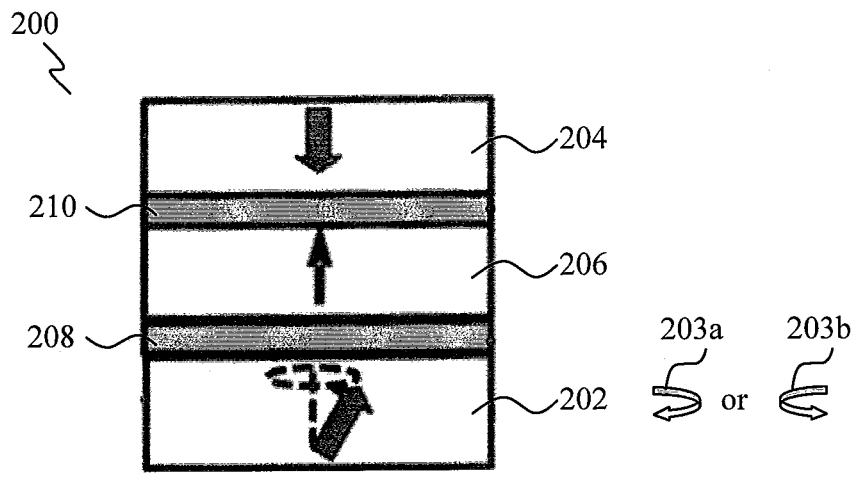
FIG. 2A shows a schematic cross-sectional view of a magnetic junction of a magnetoresistive device, according to various embodiments.

FIG. 2A shows a schematic cross-sectional view of a magnetic junction 200 of a magnetoresistive device, according to various embodiments, during operation, or in-motion or oscillating mode (e.g. when a current or a voltage is applied across the magnetic junction 200). The magnetic junction 200 includes an oscillating ferromagnetic layer (e.g. a first fixed magnetic layer structure) 202, a ferromagnetic hard layer (e.g. a second fixed magnetic layer structure) 204 and a ferromagnetic soft layer (e.g. a free magnetic layer structure) 206, arranged one over the other. The ferromagnetic hard layer 204 may be a static or fixed ferromagnetic hard layer. The oscillating ferromagnetic layer 202 may be a ferromagnetic hard layer. The ferromagnetic hard layer 204 may also be referred to as a polarizer or a polarizer layer. In addition, the oscillating ferromagnetic layer 202 may also act as a polarizer. As a non-limiting example, FIG. 2A illustrates that the ferromagnetic soft layer 206 is arranged in between the oscillating ferromagnetic layer 202 and the ferromagnetic hard layer 204.

The ferromagnetic hard layer 204 and the ferromagnetic soft layer 206 have their magnetic easy axis (e.g. magnetization orientation or direction) aligned in a perpendicular direction (i.e. perpendicular anisotropy), for example in a direction at least substantially perpendicular to a plane defined by an interface, for example an interface between the oscillating ferromagnetic layer 202 and the ferromagnetic hard layer 204 or between the ferromagnetic hard layer 204 and the ferromagnetic soft layer 206.

In the context of various embodiments, the term "easy axis" as applied to magnetism may mean an energetically favorable direction of spontaneous magnetization as a result of magnetic anisotropy. The magnetization orientation may be either of two opposite directions along the easy axis.

The magnetization orientations or directions of the oscillating ferromagnetic layer 202 and the ferromagnetic hard layer 204 are aligned in a perpendicular direction (i.e. perpendicular anisotropy), for example in a direction at least substantially perpendicular to a plane defined by an interface, for example an interface between the oscillating ferromagnetic layer 202 and the ferromagnetic hard layer 204 or between the ferromagnetic hard layer 204 and the ferromagnetic soft layer 206. Furthermore, the magnetization orientations or directions of the oscillating ferromagnetic layer 202 and the ferromagnetic hard layer 204 are oriented in opposite directions with respect to each other. For illustration purposes, each of the magnetization orientations or directions of the oscillating ferromagnetic layer 202 and the ferromagnetic hard layer 204, as represented by the respective arrows within the respective layers in FIG. 2A, may point in an upward direction or a downward direction.

The magnetization orientation of the oscillating ferromagnetic layer 202 may oscillate or precess in a direction, such as a cone direction or a direction resembling a cone (e.g. a first direction) in response to a current or a voltage applied across the magnetic junction 200 or the magnetoresistive device so as to change the magnetization orientation of the ferromagnetic soft layer 206, for example due to spin transfer torque. For example, as illustrated in FIG. 2A, the cone direction may be a direction as represented by the arrow 203a (e.g. clockwise direction) or the arrow 203b (e.g. anti-clockwise direction).

The magnetic junction 200 further includes a spacer layer 208 arranged in between the oscillating ferromagnetic layer 202 and the ferromagnetic soft layer 206. The magnetic junction 200 further includes a spacer layer 210 arranged in between the ferromagnetic hard layer 204 and the ferromagnetic soft layer 206.

In various embodiments, the spacer layer 208 may be of a conductive and non-magnetic material (e.g. Cu, Ag or Au), and the spacer layer 210 may be of a non-conductive and non-magnetic material (e.g. an insulator, e.g. MgO, $AlO_x$, or $TiO_x$) so that the tunneling magnetoresistance (TMR) signal between the ferromagnetic hard layer 204 and the ferromagnetic soft layer 206 may be dominant. However, it should be appreciated that the spacer layer 208 may also be of a non-conductive and non-magnetic material (e.g. an insulator, e.g. MgO, $AlO_x$, or $TiO_x$). Therefore, the magnetoresistive device 200 may be a tunnel magnetoresistive (TMR) device. Furthermore, it should be appreciated that the spacer layer 210 may be of a conductive and non-magnetic material (e.g. Cu, Ag or Au). Accordingly, the spacer layer 208 and/or the spacer layer 210 may be of a conductive and non-magnetic material (e.g. Cu, Ag or Au), or a non-conductive and non-magnetic material (e.g. an insulator, e.g. MgO, $AlO_x$, or $TiO_x$).

In various embodiments, where a spacer layer (e.g. spacer layers 208 and/or 210) is of a conductive and non-magnetic material (e.g. Cu), the spacer layer may have a thickness of between about 1 nm and about 20 nm, e.g. between about 1 nm and about 10 nm, between about 1 nm and about 5 nm, between about 5 nm and about 20 nm, between about 5 nm and about 10 nm, or between about 1.5 nm and about 5 nm.

In various embodiments, where a spacer layer (e.g. spacer layers 208 and/or 210) is of a non-conductive and non-magnetic material (e.g. MgO), the spacer layer may have a thickness of between about 0.2 nm and about 5 nm, e.g. between about 0.2 nm and about 3 nm, between about 0.2 nm and about 1 nm, between about 2 nm and about 5 nm or between about 0.8 nm and about 1.5 nm.

In various embodiments, the magnetic junction 200 may be configured or used in a magnetoresistive device, e.g. a giant magnetoresistive (GMR) device, with both the spacer layers 208, 210 of a conductive and non-magnetic material (e.g. Cu, Ag or Au).

In various embodiments, each of the ferromagnetic hard layer 204 and the ferromagnetic soft layer 206 may include a material having at least one of iron (Fe), cobalt (Co) and nickel (Ni) elements, for example cobalt-iron-boron (CoFeB), (Co/X) multilayer, (CoFe/X) multilayer, (CoFeB/X) multilayer where X is palladium (Pd) and/or platinum (Pt). Any combination of cobalt-iron-boron (CoFeB), (Co/X) multilayer, (CoFe/X) multilayer and (CoFeB/X) multilayer may also be provided. The (Co/X) multilayer, the (CoFe/X) multilayer and the (CoFeB/X) multilayer may include a plurality of a bilayer structure having a first layer of material (Co, CoFe and CoFeB respectively) and a second layer of Pd and/or Pt. As a non-limiting example, the ferromagnetic hard layer 204 may include $(CoFe/Pd)_5$, of 5 layers of CoFe arranged alternately with 5 layers of Pd, i.e. (Co/Pd/Co/Pd/Co/Pd/Co/Pd).

In various embodiments, each of the ferromagnetic hard layer 204 and the ferromagnetic soft layer 206 may have a thickness in a range of between about 0.3 nm and about 4 nm, for example between about 0.3 nm and about 2 nm, between about 0.3 nm and about 1 nm or between about 1 nm and about 4 nm.

While FIG. 2A illustrates that the oscillating ferromagnetic layer 202 is arranged beneath the ferromagnetic hard layer 204 and the ferromagnetic soft layer 206, it should be appreciated that the ferromagnetic hard layer 204 may instead be arranged beneath the oscillating ferromagnetic layer 202 and the ferromagnetic soft layer 206.

In addition, while FIG. 2A shows that the ferromagnetic soft layer 206 is arranged or sandwiched in between the oscillating ferromagnetic layer 202 and the ferromagnetic hard layer 204, it should be appreciated that other arrangements of the layers may be possible, for example the oscillating ferromagnetic layer 202 may be arranged or sandwiched in between the ferromagnetic soft layer 206 and the ferromagnetic hard layer 204.

Figure 2B:
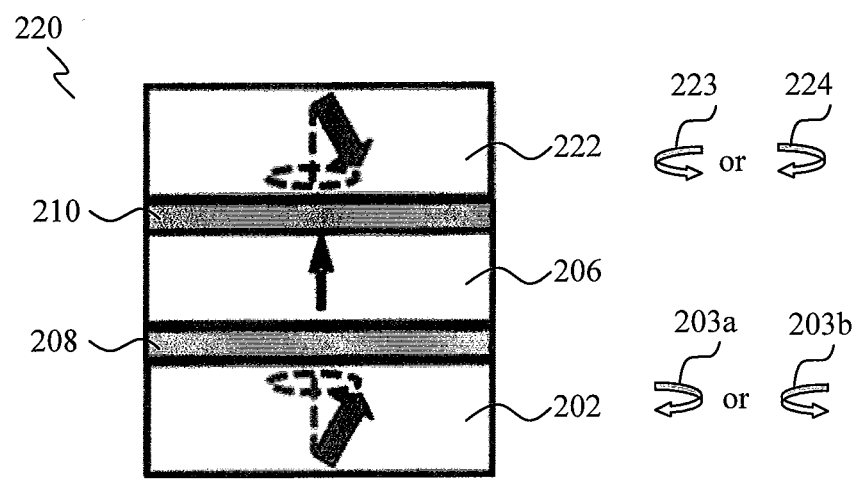
FIG. 2B shows a schematic cross-sectional view of a magnetic junction of a magnetoresistive device, according to various embodiments.

In various embodiments, the ferromagnetic hard layer 204 may be another oscillating ferromagnetic layer. FIG. 2B shows a schematic cross-sectional view of a magnetic junction 220 of a magnetoresistive device, according to various embodiments, during operation, or in-motion or oscillating mode (e.g. when a current or a voltage is applied across the magnetic junction 220). The magnetic junction 220 may be similar to the magnetic junction 200 of the embodiment of FIG. 2A and may be as described in the context of the magnetic junction 200, except that the ferromagnetic hard layer 204 is replaced by another oscillating ferromagnetic layer 222.

The magnetization orientations or directions of the oscillating ferromagnetic layer 202 and the oscillating ferromagnetic layer 222 are aligned in a perpendicular direction (i.e. perpendicular anisotropy), for example in a direction at least substantially perpendicular to a plane defined by an interface, for example an interface between the oscillating ferromagnetic layer 202 and the oscillating ferromagnetic layer 222 or between the oscillating ferromagnetic layer 222 and the ferromagnetic soft layer 206. Furthermore, the magnetization orientations or directions of the oscillating ferromagnetic layer 202 and the oscillating ferromagnetic layer 222 are oriented in opposite directions with respect to each other. The magnetization orientation of the oscillating ferromagnetic layer 222 may be configured to oscillate or precess in a direction, such as a cone direction or a direction resembling a cone (e.g. a second direction) in response to a current or a voltage applied across the magnetic junction 220 or the magnetoresistive device so as to change the magnetization orientation of the ferromagnetic soft layer 206, for example due to spin transfer torque. The direction of the oscillation of the magnetization orientation of the oscillating ferromagnetic layer 222 is opposite to the direction of the oscillation direction of the magnetization direction of the oscillating ferromagnetic layer 202. This may, for example, further enhance the spin transfer torque on the ferromagnetic soft layer 206. For example, where the direction of oscillation of the magnetization direction of the oscillating ferromagnetic layer 202 may be a cone direction as represented by the arrow 203a (e.g. clockwise direction), the direction of oscillation of the magnetization direction of the oscillating ferromagnetic layer 222 may be a cone direction as represented by the arrow 223 (e.g. anti-clockwise direction). It should be appreciated that the directions of the arrows 203a and 223 may be respectively reversed (e.g. as represented by the arrows 203b and 224).

The physics of the switching process lies in the spin transfer from a polarized electric current to a ferromagnetic layer, and the spin from the polarized current may exert a "torque" which acts to reverse the magnetization of the ferromagnetic layer. The mechanism of the spin torque transfer may be governed by the Slonczewski spin torque term or other symmetric/asymmetric factor torque terms.

As the switching time may be strongly correlated to the magnitude of the spin torque, it would be desirable to increase the average spin torque magnitude during the magnetization reversal process, and the magnetoresistive device of various embodiments may achieve this effect in two ways. Firstly, the incorporation of the oscillating ferromagnetic layer 202 acts as another source of spin torque, in addition to the ferromagnetic hard layer 204. Secondly, the oscillating nature of the oscillating ferromagnetic layer 202 may increase the average angle between the magnetization vectors or orientations of the oscillating ferromagnetic layer 202 and the ferromagnetic soft layer 206, as compared to the use of a static polarizer. The oscillating ferromagnetic layer 202 may provide the required oscillating polarizer dynamics which may assist in the spin torque switching, for example in perpendicular anisotropic magnetoresistive devices.

In addition, by having the magnetization vectors or orientations of the oscillating ferromagnetic layer 202 and the ferromagnetic hard layer 204 aligned or oriented in opposite directions to each other, current asymmetry may be minimised so that for both positive and negative applied writing currents (or positive and negative biasing of applied voltages), the spin torque of both the oscillating ferromagnetic layer 202 and the ferromagnetic hard layer 204 would act in a way to aid in the switching from the parallel state (P) to the anti-parallel (AP) state (P→AP), and the switching from the anti-parallel (AP) state to the parallel state (P) state (AP→P).

Furthermore, it is desirable that the oscillating ferromagnetic layer 202 oscillates with a fixed direction (e.g. a fixed cone direction) for both positive and negative writing currents, so that the spin torque induced, generated or provided by the oscillating ferromagnetic layer 202 may aid in the switching of both P→AP and AP→P.

Figure 3:
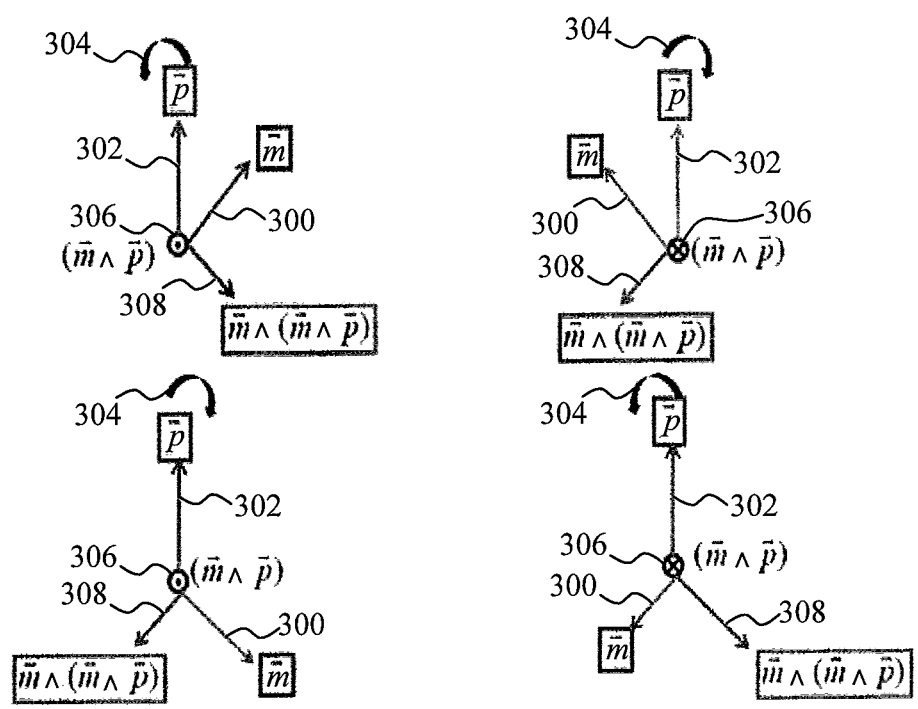
FIG. 3 shows different configurations of magnetization and polarization during a switching process.

FIG. 3 shows different configurations of magnetization and polarization during the switching process. As shown by the configurations of FIG. 3 of magnetization vector $\vec{m}$, as represented by the arrow 300, of a ferromagnetic soft layer (free layer) (e.g. layer 206) with respect to the vector $\vec{P}$, as represented by the arrow 302, of a polarizer (e.g. layer 204), the polarization $\vec{P}$ needs to oscillate in order to increase the spin torque magnitude. The arrow as represented by 304 shows the direction the polarizer should move in order to increase the spin torque magnitude (i.e. the arrow 304 indicates the oscillation of the polarization vector $\vec{P}$ 302. The circle as represented by 306 shows the result of the vector which is the wedge product of the magnetization vector $\vec{m}$ 300 and the polarization vector $\vec{P}$ 302 (i.e. $\vec{m} \wedge \vec{P}$). The vector 306 is perpendicular to both the magnetization vector $\vec{m}$ 300 and the polarization vector $\vec{P}$ 302. The circle 306 including a dot in the center represents a direction pointing out of the page, while the circle 306 including a cross within the circle 306 represents a direction pointing into the page. The arrow as represented by 308 shows the result of the operation ($\vec{m} \wedge (\vec{m} \wedge \vec{P})$). The symbol "$\wedge$" represents the wedge product of vectors.

The polarizer or polarization direction 302 denotes the spin polarization of the electrons acquired from passing through a preceding layer of a free layer or a soft layer, or from back scattering from a succeeding layer of a free layer or a soft layer, when considered from the perspective of the path of flow of electrons. In the scheme of Frequency-Induced Spin Torque Switching (FISTS) as described below, the polarization may be due to, but not limited to, the oscillating ferromagnetic layer (e.g. 202).

In various embodiments, by applying the appropriate oscillating frequency to the polarizer so that the angle between $\vec{m}$ 300 and $\vec{P}$ 302 may be optimized in the switching process, increased switching speed may be achieved, while reducing the current asymmetry of the P→AP and AP→P processes. This scheme may be referred to as Frequency-Induced Spin Torque Switching (FISTS), and which forms the basis for the magnetoresistive device of various embodiments, for example as that illustrated in FIG. 2A, where the oscillating ferromagnetic layer 202 may provide the required oscillating polarizer dynamics which may assist in the spin torque switching, for example in perpendicular anisotropic magnetoresistive devices. For implementing FISTS, it is desirable that the oscillating ferromagnetic layer 202 oscillates or precesses with a fixed direction (e.g. a fixed cone direction) for both positive and negative writing currents, so that the spin torque induced, generated or provided by the oscillating ferromagnetic layer 202 may aid in the switching of both P→AP and AP→P.

The oscillating ferromagnetic layer (e.g. 202) of various embodiments will now be described by way of the following non-limiting examples. The descriptions for the oscillating ferromagnetic layer (e.g. 202) may also be applicable to the oscillating ferromagnetic 222, with suitable adaptations.

Figure 4A:
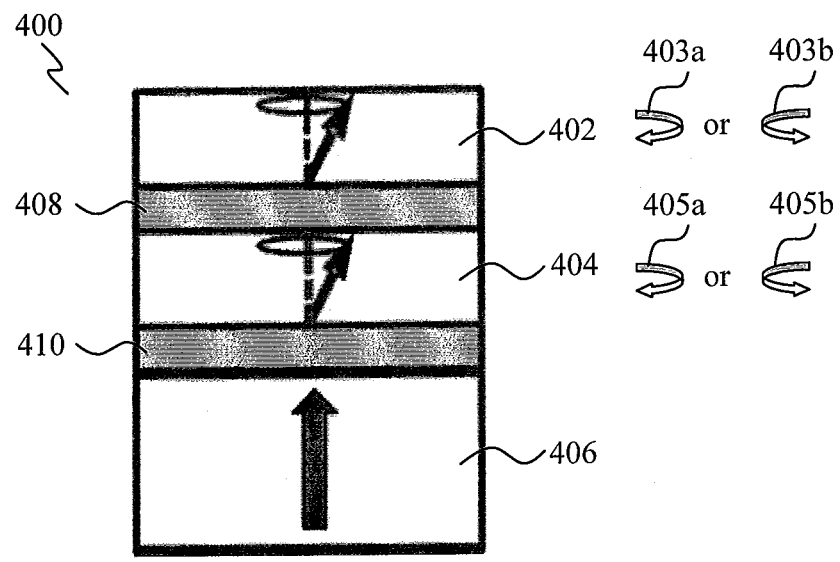
FIG. 4A shows a schematic cross-sectional view of an oscillating ferromagnetic layer, according to various embodiments.

FIG. 4A shows a schematic cross-sectional view of an oscillating ferromagnetic layer 400, according to various embodiments, during operation, or in-motion or oscillating mode (e.g. when a current or a voltage is applied across the magnetic junction including the oscillating ferromagnetic layer 400). The oscillating ferromagnetic layer 400 includes a ferromagnetic layer (e.g. a first ferromagnetic layer) 402 with a perpendicular anisotropy component, a ferromagnetic layer (e.g. a second ferromagnetic layer) 404 with an in-plane anisotropy component (i.e. in an initial state or rest state, the magnetization orientation of the ferromagnetic layer 404 points in a left or right direction) and a ferromagnetic hard layer 406 with a perpendicular anisotropy component, the ferromagnetic layer 402, the ferromagnetic layer 404 and the ferromagnetic hard layer 406 arranged one over the other. In other words, the ferromagnetic layer 402 and the ferromagnetic hard layer 406 have respective magnetization orientations configured to orient in a direction at least substantially perpendicular to a plane defined by an interface, for example an interface between the ferromagnetic layer 402 and the ferromagnetic layer 404 or between the ferromagnetic layer 402 and the ferromagnetic hard layer 406. The ferromagnetic layer 404 has a magnetization orientation configured to orient in a direction at least substantially parallel to a plane defined by an interface, for example an interface between the ferromagnetic layer 402 and the ferromagnetic layer 404 or between the ferromagnetic layer 402 and the ferromagnetic hard layer 406. As a non-limiting example, FIG. 4A illustrates that the ferromagnetic layer 402 is arranged or stacked on top of the ferromagnetic layer 404, which in turn in arranged or stacked on top of the ferromagnetic hard layer 406.

As shown in FIG. 4A, during operation or during in-motion or oscillating mode, the respective magnetization orientations of the ferromagnetic layer 402 and the ferromagnetic layer 404 may oscillate or precess in a direction, such as a cone direction or a direction resembling a cone, in response to a current or a voltage applied across the magnetic junction or the magnetoresistive device so as to change the magnetization orientation of a ferromagnetic soft layer (e.g. 206), for example due to spin transfer torque. As a non-limiting example, with reference to FIGS. 2A and 4A, the structure of the oscillating ferromagnetic layer 202 may be that of the oscillating ferromagnetic layer 400. Where the oscillating ferromagnetic layer 202 is configured such that the magnetization orientation of the oscillating ferromagnetic layer 202 oscillates in a direction, e.g. the cone direction as represented by the arrow 203a (e.g. clockwise direction), the magnetization orientation of the ferromagnetic layer 402 oscillate in a similar clockwise direction, as represented by the arrow 403a, while the magnetization orientation of the ferromagnetic layer 404 may oscillate in a clockwise direction or anti-clockwise direction, as represented respectively by the arrows 405a and 405b. Where the oscillating ferromagnetic layer 202 is configured such that the magnetization orientation of the oscillating ferromagnetic layer 202 oscillates in a direction, e.g. the cone direction as represented by the arrow 203b (e.g. anti-clockwise direction), the magnetization orientation of the ferromagnetic layer 402 oscillate in a similar anti-clockwise direction, as represented by the arrow 403b, while the magnetization orientation of the ferromagnetic layer 404 may oscillate in a clockwise direction or anti-clockwise direction, as represented respectively by the arrows 405a and 405b. While the ferromagnetic layer 404 has an in-plane anisotropy component in the initial state or rest state, the magnetization orientation of the ferromagnetic layer 404 may be configured to oscillate or precess in the direction 405a or 405b (similar to directions 403a or 403b for the ferromagnetic layer 402 having a perpendicular anisotropy component) due to the effect of the ferromagnetic hard layer 406. The electrons acquire polarization in the polarization direction of the ferromagnetic hard layer 406, and the spin torque from these electrons act on the ferromagnetic layer 404. Due to the in-plane anisotropy of the ferromagnetic layer 404, the ferromagnetic layer 404 may respond to the spin torque in such a way that it may oscillate or precess in a cone direction (e.g. 405a or 405b) whose axis is perpendicular to the plane by an interface, for example an interface between the ferromagnetic layer 402 and the ferromagnetic layer 404 or between the ferromagnetic layer 402 and the ferromagnetic hard layer 406, similar to that for the ferromagnetic layer 402.

In various embodiments, the ferromagnetic layer 402 and the ferromagnetic layer 404 may be 'softer' (i.e. ferromagnetically softer) than the ferromagnetic hard layer 406. In various embodiments, the ferromagnetic layer 402 and the ferromagnetic layer 404 may or may not be 'softer' (i.e. ferromagnetically softer) than the ferromagnetic soft layer 206 (FIGS. 2A and 2B).

The oscillating ferromagnetic layer 400 further includes a spacer layer 408 arranged in between the ferromagnetic layer 402 and the ferromagnetic layer 404. The oscillating ferromagnetic layer 400 further includes a spacer layer 410 arranged in between the ferromagnetic layer 404 and the ferromagnetic hard layer 406.

In various embodiments, each of the spacer layers 408, 410 may be of a conductive and non-magnetic material (e.g. Cu, Ag or Au). In various embodiments, each of the spacer layers 408, 410 may have a thickness of at least 1.5 nm, for example a thickness of between about 1.5 nm and 20 nm, e.g. between about 1.5 nm and 10 nm, between about 1.5 nm and 5 nm, between about 5 nm and 20 nm or between about 5 nm and 10 nm.

In various embodiments, each of the ferromagnetic layer 402 and the ferromagnetic layer 404 may include a material, including but not limited to cobalt (Co), cobalt-iron (CoFe), cobalt-iron-boron (CoFeB) or any combinations thereof.

In various embodiments, each of the ferromagnetic layer 402 and the ferromagnetic layer 404 may have a thickness in a range of between about 0.5 nm and about 4 nm, for example between about 0.5 nm and about 2 nm, between about 0.5 nm and about 1 nm or between about 1 nm and about 4 nm.

In various embodiments, the ferromagnetic hard layer 406 may include a material having at least one of iron (Fe), cobalt (Co) and nickel (Ni) elements, for example cobalt-iron-boron (CoFeB), (Co/X) multilayer, (CoFe/X) multilayer, (CoFeB/X) multilayer where X is palladium (Pd) and/or platinum (Pt). Any combination of cobalt-iron-boron (CoFeB), (Co/X) multilayer, (CoFe/X) multilayer and (CoFeB/X) multilayer may also be provided. The (Co/X) multilayer, the (CoFe/X) multilayer and the (CoFeB/X) multilayer may include a plurality of a bilayer structure having a first layer of material (Co, CoFe and CoFeB respectively) and a second layer of Pd and/or Pt. As a non-limiting example, the ferromagnetic hard layer 406 may include $(CoFe/Pd)_5$, of 5 layers of CoFe arranged alternately with 5 layers of Pd, i.e. (Co/Pd/Co/Pd/Co/Pd/Co/Pd/Co/Pd).

In various embodiments, the ferromagnetic hard layer 406 may have a thickness of between about 3 nm and about 50 nm, e.g. between about 3 nm and about 20 nm, between about 3 nm and about 10 nm, between about 10 nm and about 50 nm, between about 30 nm and about 50 nm or between about 5 nm and about 20 nm.

While FIG. 4A illustrates that the ferromagnetic hard layer 406 is arranged beneath the ferromagnetic layer 402 and the ferromagnetic layer 404, it should be appreciated that other arrangements of the ferromagnetic layer 402, the ferromagnetic layer 404 and the ferromagnetic hard layer 406 may be possible.

Figure 4B:
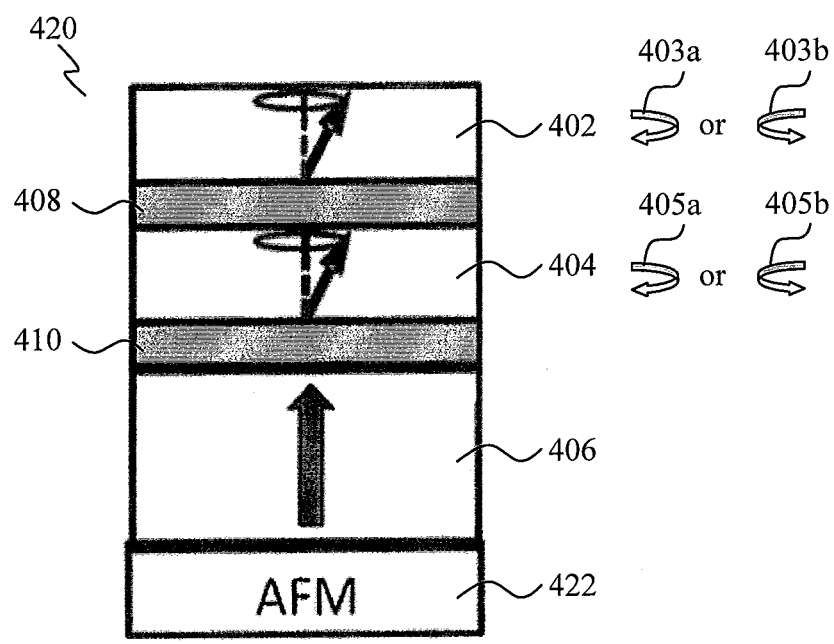
FIG. 4B shows a schematic cross-sectional view of an oscillating ferromagnetic layer, according to various embodiments.

FIG. 4B shows a schematic cross-sectional view of an oscillating ferromagnetic layer 420, according to various embodiments. The oscillating ferromagnetic layer 420 includes a ferromagnetic layer (e.g. a first ferromagnetic layer) 402 with a perpendicular anisotropy component, a ferromagnetic layer (e.g. a second ferromagnetic layer) 404 with an in-plane anisotropy component and a ferromagnetic hard layer 406 with a perpendicular anisotropy component, the ferromagnetic layer 402, the ferromagnetic layer 404 and the ferromagnetic hard layer 406 arranged one over the other. The ferromagnetic layer 402, the ferromagnetic layer 404 and the ferromagnetic hard layer 406 may be as described in the context of the embodiment of FIG. 4A.

The oscillating ferromagnetic layer 420 further includes a spacer layer 408 arranged in between the ferromagnetic layer 402 and the ferromagnetic layer 404. The oscillating ferromagnetic layer 400 further includes a spacer layer 410 arranged in between the ferromagnetic layer 404 and the ferromagnetic hard layer 406. The spacer layers 408, 410 may be as described in the context of the embodiment of FIG. 4A.

The oscillating ferromagnetic layer 420 may further include an antiferromagnetic layer 422, where the ferromagnetic hard layer 406 may be arranged over or stacked on top of the antiferromagnetic layer 422, which pins the magnetization of the ferromagnetic hard layer 406.

In various embodiments, the antiferromagnetic layer 422 may include a material of X-manganese or X-Y-manganese, wherein each of X and Y may be platinum (Pt), palladium (Pd), iridium (Ir), rhodium (Rh) or ruthenium (Ru).

In various embodiments, the antiferromagnetic layer 422 may have a thickness in a range of between about 5 nm and about 20 nm, for example between about 5 nm and about 15 nm, between about 5 nm and about 10 nm or between about 10 nm and about 20 nm.

Figure 5A:
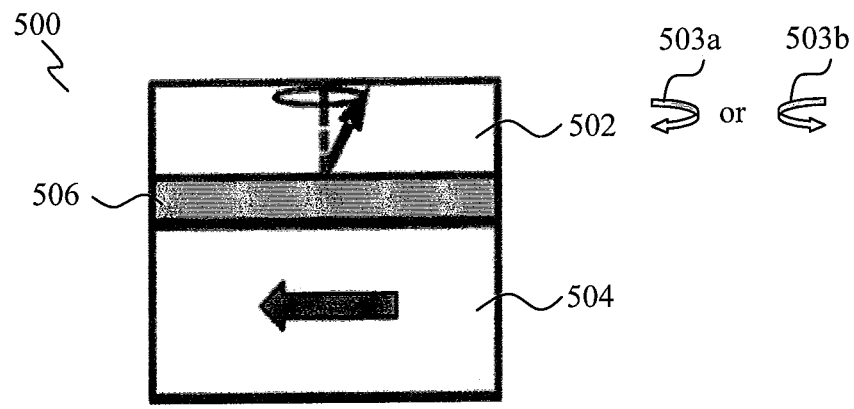
FIG. 5A shows a schematic cross-sectional view of an oscillating ferromagnetic layer, according to various embodiments.

FIG. 5A shows a schematic cross-sectional view of an oscillating ferromagnetic layer 500, according to various embodiments, during operation, or in-motion or oscillating mode (e.g. when a current or a voltage is applied across the magnetic junction including the oscillating ferromagnetic layer 500). The oscillating ferromagnetic layer 500 includes a ferromagnetic layer 502 with a perpendicular anisotropy component and a ferromagnetic hard layer 504 with an in-plane anisotropy component, the ferromagnetic layer 502 and the ferromagnetic hard layer 504 arranged one over the other. In other words, the ferromagnetic layer 502 has a magnetization orientation configured to orient in a direction at least substantially perpendicular to a plane defined by an interface, for example an interface between the ferromagnetic layer 502 and the ferromagnetic hard layer 504. The ferromagnetic hard layer 504 has a magnetization orientation configured to orient in a direction at least substantially parallel to a plane defined by an interface, for example an interface between the ferromagnetic layer 502 and the ferromagnetic hard layer 504. As a non-limiting example, FIG. 5A illustrates that the ferromagnetic layer 502 is arranged or stacked on top of the ferromagnetic hard layer 504.

As shown in FIG. 5A, during operation or during in-motion or oscillating mode, the magnetization orientation of the ferromagnetic layer 502 may oscillate or precess in a direction, such as a cone direction or a direction resembling a cone, in response to a current or a voltage applied across the magnetic junction or the magnetoresistive device so as to change the magnetization orientation of a ferromagnetic soft layer (e.g. 206), for example due to spin transfer torque. As a non-limiting example, with reference to FIGS. 2A and 5A, the structure of the oscillating ferromagnetic layer 202 may be that of the oscillating ferromagnetic layer 500. Where the oscillating ferromagnetic layer 202 is configured such that the magnetization orientation of the oscillating ferromagnetic layer 202 oscillates in a direction, e.g. the cone direction as represented by the arrow 203a (e.g. clockwise direction), the magnetization orientation of the ferromagnetic layer 502 oscillates in a similar clockwise direction, as represented by the arrow 503a. Where the oscillating ferromagnetic layer 202 is configured such that the magnetization orientation of the oscillating ferromagnetic layer 202 oscillates in a direction, e.g. the cone direction as represented by the arrow 203b (e.g. anti-clockwise direction), the magnetization orientation of the ferromagnetic layer 502 oscillates in a similar anti-clockwise direction, as represented by the arrow 503b. In various embodiments, the direction of the in-plane anisotropy (e.g. in the left or right direction) of the ferromagnetic hard layer 504 may affect the direction of the oscillation of the ferromagnetic layer 502 (e.g. clockwise direction 503a or anti-clockwise direction 503b).

In various embodiments, the ferromagnetic layer 502 may be 'softer' (i.e. ferromagnetically softer) than the ferromagnetic hard layer 504. In various embodiments, the ferromagnetic layer 502 may or may not be 'softer' (i.e. ferromagnetically softer) than the ferromagnetic soft layer 206 (FIGS. 2A and 2B).

The oscillating ferromagnetic layer 500 further includes a spacer layer 506 arranged in between the ferromagnetic layer 502 and the ferromagnetic hard layer 504. In various embodiments, the spacer layer 506 may be of a conductive and non-magnetic material (e.g. Cu, Ag or Au). In various embodiments, the spacer layer 506 may have a thickness of at least 1.5 nm, for example a thickness of between about 1.5 nm and 20 nm, e.g. between about 1.5 nm and 10 nm, between about 1.5 nm and 5 nm, between about 5 nm and 20 nm or between about 5 nm and 10 nm.

In various embodiments, the ferromagnetic layer 502 may include a material having at least one of iron (Fe), cobalt (Co) and nickel (Ni) elements, for example cobalt-iron-boron (CoFeB), (Co/X) multilayer, (CoFe/X) multilayer, (CoFeB/X) multilayer where X is palladium (Pd) and/or platinum (Pt). Any combination of cobalt-iron-boron (CoFeB), (Co/X) multilayer, (CoFe/X) multilayer and (CoFeB/X) multilayer may also be provided. The (Co/X) multilayer, the (CoFe/X) multilayer and the (CoFeB/X) multilayer may include a plurality of a bilayer structure having a first layer of material (Co, CoFe and CoFeB respectively) and a second layer of Pd and/or Pt. As a non-limiting example, the ferromagnetic layer 502 may include $(CoFe/Pd)_5$, of 5 layers of CoFe arranged alternately with 5 layers of Pd, i.e. (Co/Pd/Co/Pd/Co/Pd/Co/Pd/Co/Pd).

In various embodiments, the ferromagnetic layer 502 may have a thickness in a range of between about 0.3 nm and about 4 nm, for example between about 0.3 nm and about 2 nm, between about 0.3 nm and about 1 nm or between about 1 nm and about 4 nm.

Figure 5B:
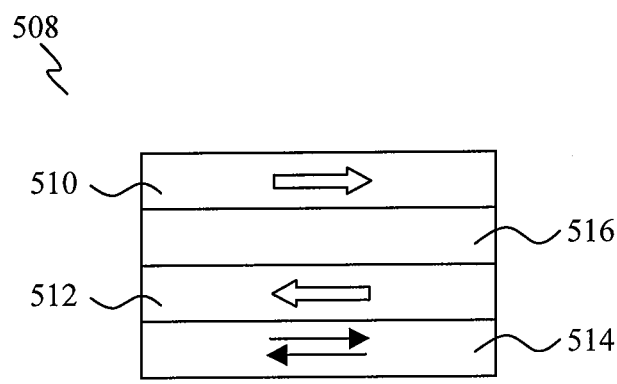
FIG. 5B shows a schematic cross-sectional view of a synthetic antiferromagnetic layer, according to various embodiments.

In various embodiments, the ferromagnetic hard layer 504 may be a single ferromagnetic layer or a synthetic antiferromagnetic layer (SAF). In various embodiments, the ferromagnetic hard layer 504 may include a material, including but not limited to cobalt (Co), cobalt-iron (CoFe), cobalt-iron-boron (CoFeB) or any combinations thereof. In embodiments where the ferromagnetic hard layer 504 may be a synthetic antifferomagnetic layer (SAF), as illustrated in FIG. 5B, the SAF 508 may include two antiferromagnetically coupled ferromagnetic layers 510, 512, pinned by an antiferromagnetic layer 514. A metal spacer layer 516, for example a conductive and non-magnetic spacer layer (e.g. ruthenium (Ru)) may be sandwiched in between the two antiferromagnetically coupled ferromagnetic layers 510, 512. As a non-limiting example, the synthetic antiferromagnetic layer 508 may have a structure or arrangement having two ferromagnetic layers 510, 512, with a metal spacer layer 516 having Ruderman-Kittel-Kasuya-Yosida (RKKY) coupling, such as but not limited to ruthenium (Ru), sandwiched in between the two ferromagnetic layers 510, 512. One of the ferromagnetic layers may be a reference layer 510 while the other ferromagnetic layer is a pinned layer 512, and in contact with an antiferromagnetic layer 514 (e.g. including a material including X-manganese or X-Y-manganese, wherein each of X and Y is selected from the group consisting of platinum (Pt), palladium (Pd), iridium (Ir), rhodium (Rh) and ruthenium (Ru)). By employing the metal spacer layer 516 with an appropriate thickness, the magnetization orientations of the two ferromagnetic layers 510, 512, may be anti-aligned (i.e. the layers 510, 512 may be antiferromagnetically coupled). In various embodiments, the SAF 504 may pin the reference layer 510 and may reduce stray magnetic field that may act on the ferromagnetic soft layer (e.g. 206).

In various embodiments, the ferromagnetic hard layer 504 may have a thickness in a range of between about 0.5 nm and about 4 nm, for example between about 0.5 nm and about 2 nm, between about 0.5 nm and about 1 nm or between about 1 nm and about 4 nm.

Figure 5C:
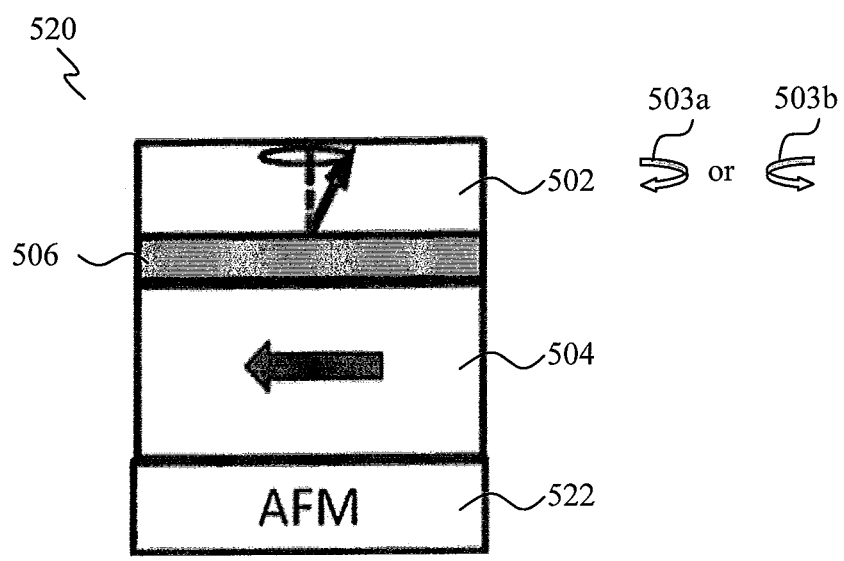
FIG. 5C shows a schematic cross-sectional view of an oscillating ferromagnetic layer, according to various embodiments.

FIG. 5C shows a schematic cross-sectional view of an oscillating ferromagnetic layer 520, according to various embodiments. The oscillating ferromagnetic layer 520 includes a ferromagnetic layer 502 with a perpendicular anisotropy component and a ferromagnetic hard layer 504 with an in-plane anisotropy component, the ferromagnetic layer 502 and the ferromagnetic hard layer 504 arranged one over the other. The ferromagnetic layer 502 and the ferromagnetic hard layer 504 may be as described in the context of the embodiment of FIG. 5A.

The oscillating ferromagnetic layer 520 further includes a spacer layer 506 arranged in between the ferromagnetic layer 502 and the ferromagnetic hard layer 504. The spacer layer 506 may be as described in the context of the embodiment of FIG. 5A.

The oscillating ferromagnetic layer 520 may further include an antiferromagnetic layer 522, where the ferromagnetic hard layer 504 may be arranged over or stacked on top of the antiferromagnetic layer 522, which pins the magnetization of the ferromagnetic hard layer 504.

In various embodiments, the antiferromagnetic layer 522 may include a material of X-manganese or X-Y-manganese, wherein each of X and Y may be platinum (Pt), palladium (Pd), iridium (Ir), rhodium (Rh) or ruthenium (Ru).

In various embodiments, the antiferromagnetic layer 522 may have a thickness in a range of between about 5 nm and about 20 nm, for example between about 5 nm and about 15 nm, between about 5 nm and about 10 nm or between about 10 nm and about 20 nm.

The predicted improvements in the switching performance of the magnetoresistive devices of various embodiments may be investigated using macrospin simulations. The following parameters may be used for the macrospin simulation:

γ: gyromagnetic ratio=$1.76 \times 10^{11}$ $T^{-1}$ $s^{-1}$ ($1.76 \times 10^7$ $Oe^{-1}$ $s^{-1}$)

$M_s$: saturation magnetization=$0.7 \times 10^6$ A/m (700 emu/$cm^3$)

α: Gilbert damping constant=0.01 d: sample thickness=2 nm $\eta_{polarizer}$: Polarizer polarization factor=0.4

$\eta_{oscillator}$: Oscillator polarization factor=0.4

$H_k$: Free layer perpendicular anisotropic field=1 T

Using FIG. 2A as a reference, the polarizer refers to the ferromagnetic hard layer 204, while the oscillator refers to the oscillating ferromagnetic layer 202.

Figure 6A:
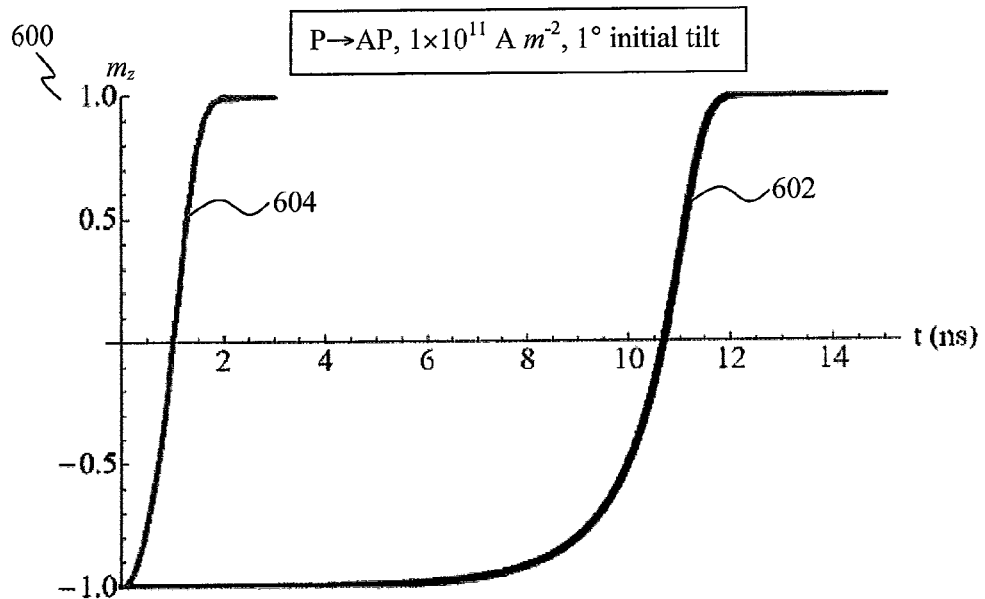
FIGS. 6A and 6B show plots of macrospin simulation results of the Mz component of the free magnetic layer structure magnetization as a function of time for P→AP and AP→P respectively, according to various embodiments.
Figure 6B:
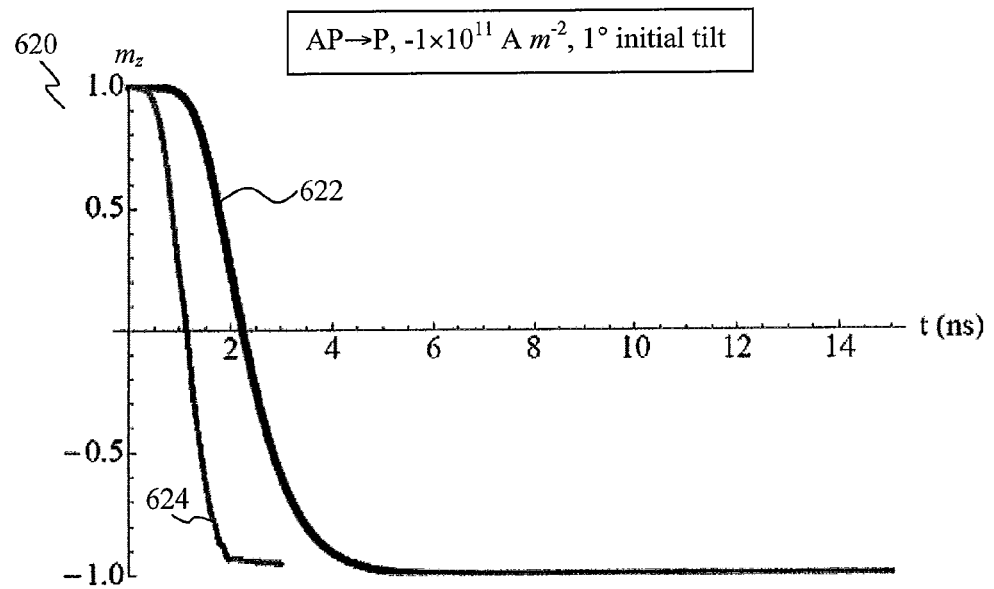

FIGS. 6A and 6B show plots 600, 620 of macrospin simulation results of the Mz component of the free magnetic layer structure magnetization as a function of time for P→AP and AP→P respectively, according to various embodiments. The plot 600 shows the macrospin simulation results for conventional switching 602 and frequency switching 604 when a 3 GHz oscillation is applied to the magnetoresistive device of various embodiments for P→AP. The plot 620 shows the macrospin simulation results for conventional switching 622 and frequency switching 624 when a 3 GHz oscillation is applied to the magnetoresistive device of various embodiments for AP→P. The free magnetic layer structure (soft layer) is initially set to have a very small tilt of about 1° from the perpendicular axis.

As shown in FIG. 6A, a reduction of the free magnetic layer structure magnetization reversal time may be observed from about 10.6 ns to about 1 ns for P→AP. As shown in FIG. 6B, a reduction of the free magnetic layer structure magnetization reversal time may be observed from about 2.2 ns to about 1.1 ns for AP→P. In both situations, the spin torque current density is about $1 \times 10^{11}$ $A/m^2$.

Figure 7A:
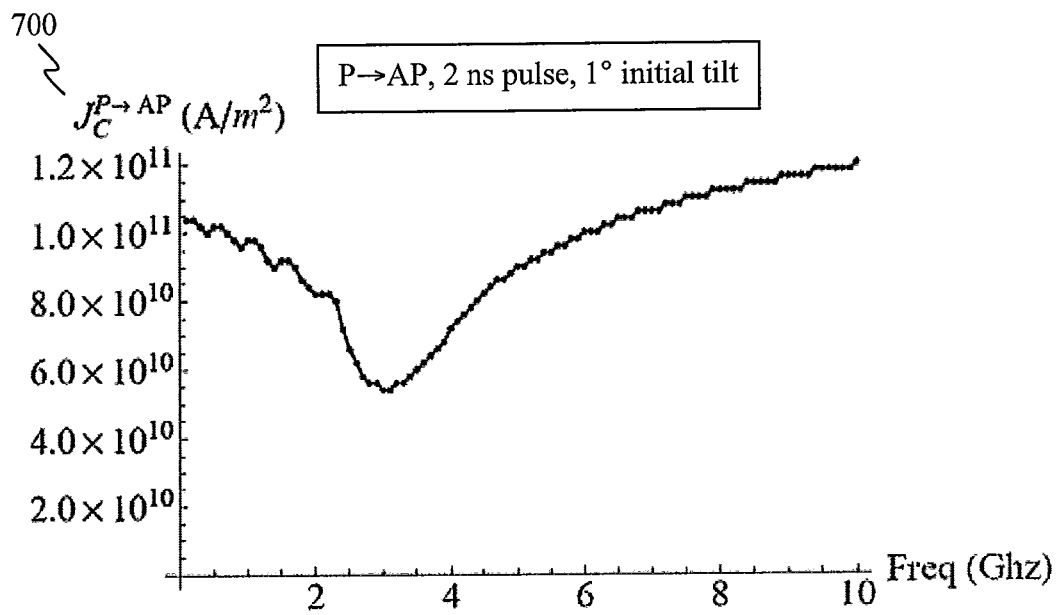
FIGS. 7A and 7B show plots of macrospin simulation results of the critical current for P→AP and AP→P respectively when a 3 GHz oscillation is applied, according to various embodiments.
Figure 7B:
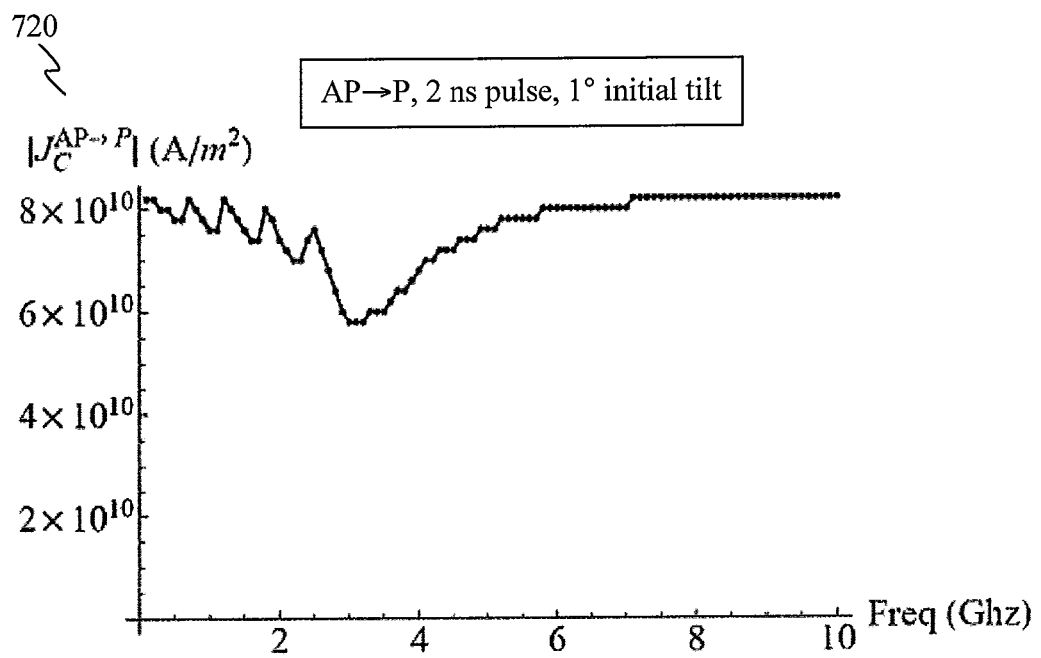

FIGS. 7A and 7B show plots 700, 720 of macrospin simulation results of the critical current, $J_c$, for P→AP and AP→P respectively when a 3 GHz oscillation is applied, according to various embodiments. The free magnetic layer structure (soft layer) is initially set to have a very small tilt of about 1° from the perpendicular axis. As shown in FIGS. 7A and 7B, there is a reduction in the critical current, $J_c$, when a 3 GHz oscillation is applied, for both $J_c^{P \to AP}$ and $|J_c^{AP \to P}|$. In addition, there is a sharp reduction of switching current asymmetry when the additional polarizer (e.g. oscillating ferromagnetic layer 202) is oscillating close to resonance frequency. In the context of various embodiments, the resonance frequency refers to the oscillating frequency of the additional polarizer (e.g. oscillating ferromagnetic layer 202) at which the ferromagnetic soft layer (e.g. 206) may switch with the smallest critical current for a given pulse length, or equivalently may switch in the fastest time for a given current pulse time width. In various embodiments, the resonance frequency may be but not limited to 3 GHz.

Figure 8A:
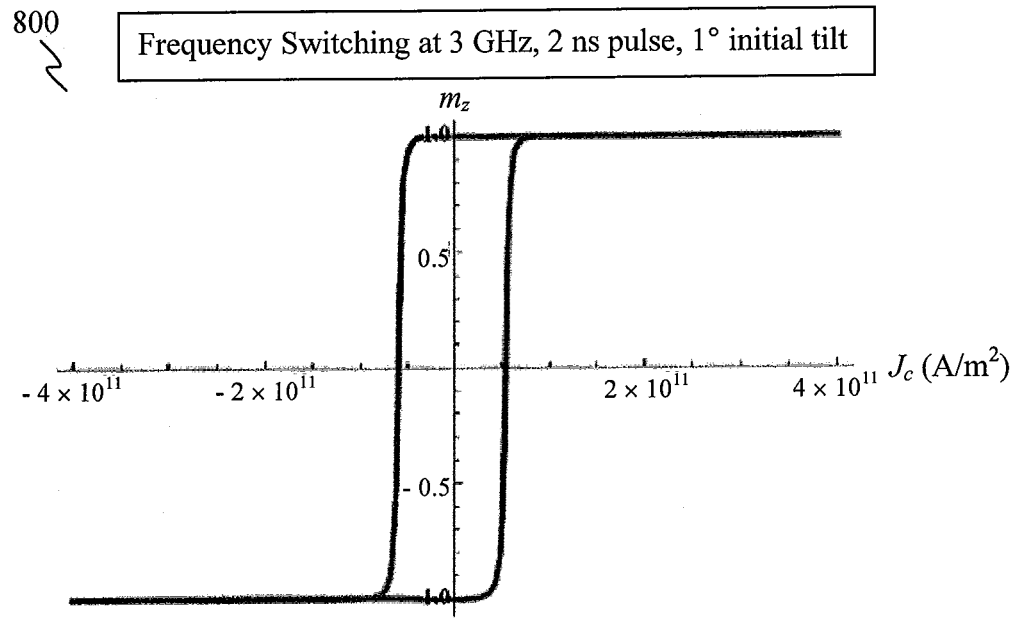
FIGS. 8A and 8B show plots of macrospin simulation results of the hysteresis loop of perpendicular component (Mz) of the free magnetic layer structure magnetization as a function of current density for frequency switching of various embodiments and conventional switching, respectively.
Figure 8B:
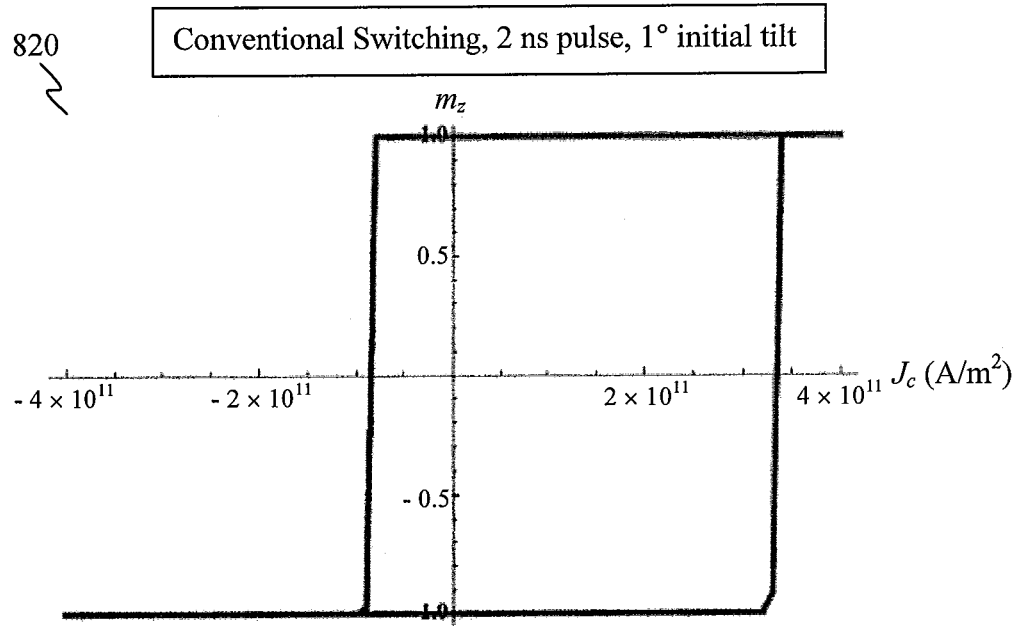

FIGS. 8A and 8B show plots 800, 820 of macrospin simulation results of the hysteresis loop of perpendicular component (Mz) of the free magnetic layer structure magnetization as a function of current density for frequency switching of various embodiments and conventional switching, respectively.

The plot 800 shows the macrospin simulation results for frequency switching of a magnetoresistive device of various embodiments where the free magnetic layer structure (soft layer) is under a perpendicular polarizer (e.g. ferromagnetic hard layer 204, FIG. 2A) with an efficiency (or polarizer polarization factor) of about 0.4 and a high frequency polarizer (e.g. oscillating ferromagnetic layer 202, FIG. 2A) oscillating at about 3 GHz.

The plot 820 shows the macrospin simulation results for conventional switching where the free magnetic layer structure (soft layer) is under a perpendicular polarizer with an efficiency of about 0.4.

As shown in FIGS. 8A and 8B, the signal asymmetry may be reduced when a high frequency spin torque is applied to the magnetoresistive device of various embodiments. The asymmetry may be reduced to almost or approaching zero at the resonance frequency.

In view of the above, therefore, various embodiments may provide a magnetoresistive device based on a perpendicular spin torque transfer magnetic random access memory (STT-MRAM), where the magnetization orientation of the free magnetic layer structure (e.g. soft layer) and the fixed magnetic layer structure (e.g. hard layer or reference layer) are aligned along a same easy axis, which may have a reduced (i) switching current asymmetry, (ii) switching current density, and (iii) switching time of the free magnetic layer structure, for example in a magnetic tunneling junction. In various embodiments, the magnetoresistive device may be based on a high frequency spin torque oscillator (e.g. oscillating ferromagnetic layer 202). The high frequency spin torque oscillator may act on the free magnetic layer structure (soft layer) magnetization from one side, for example exerting a spin torque, while the fixed magnetic layer structure (reference layer) with a perpendicular anisotropy component may exert a spin torque from another side, which may be opposite to that of the high frequency spin torque oscillator. As an example, for use in the FISTS scheme, the high frequency spin torque oscillator (e.g. oscillating ferromagnetic layer 202) may be employed for a frequency range of between about 1 GHz and about 70 GHz, e.g. between about 1 GHz and about 50 GHz, between about 1 GHz and about 20 GHz, between about 1 GHz and about 10 GHz, between about 30 GHz and about 70 GHz or between about 50 GHz and about 70 GHz.

In various embodiments, the high frequency spin-torque oscillator may include a hard magnetic or hard ferromagnetic layer (e.g. 406) with a perpendicular anisotropy (which may be referred to as the pinned layer), a soft magnetic layer (e.g. 404) with an in-plane anisotropy, and an oscillating ferromagnetic layer (e.g. 402) with a perpendicular anisotropy which may oscillate or precess in an upward cone fashion (e.g. as illustrated in FIG. 4A, and with arrows 403a or 403b), regardless of the direction of the current applied.

It should be appreciated that other configurations or arrangements that at least substantially maintain a constant or fixed oscillation direction (e.g. a fixed cone direction) may be possible.

Based on macromagnetic simulations or macrospin simulations (results shown in FIGS. 6A, 6B, 7A, 7B, 8A, 8B), there is a resonance frequency where the free layer (free magnetic layer structure) switching time, switching critical current density, and asymmetry are all substantially reduced.

In addition, a reduction of switching current may be observed for both parallel to antiparallel state ($J_c^{P\text{-}AP}$), and antiparallel to parallel state ($J_c^{AP\text{-}P}$) when compared to conventional schemes in perpendicular anisotropy devices. Therefore, a magnetoresistive device including a high frequency oscillator may help to reduce the switching current and the switching time, and minimize the switching current asymmetry.

While the preferred embodiments of the devices and methods have been described in reference to the environment in which they were developed, they are merely illustrative of the principles of the inventions. Other embodiments and configurations may be devised without departing from the spirit of the inventions and the scope of the appended claims.

We claim:

1. A magnetoresistive device having a magnetic junction, the magnetic junction comprising:
    a first magnetic layer structure having a magnetization orientation, the first magnetic layer structure comprising a first sub-layer and a second sub-layer;
    a second magnetic layer structure having a magnetization orientation that is fixed or that is able to oscillate; and
    a free magnetic layer structure having a variable magnetization orientation;
    wherein the second magnetic layer structure is arranged on top of the free magnetic layer structure;
    wherein the free magnetic layer structure is arranged on top of the first magnetic layer structure, in between the first magnetic layer structure and the second magnetic layer structure;
    wherein the first sub-layer of the first magnetic layer structure, the second magnetic layer structure and the free magnetic layer structure have perpendicular anisotropy;
    wherein the second sub-layer of the first magnetic layer structure has in-plane anisotropy;
    wherein a magnetization orientation of the first sub-layer of the first magnetic layer structure and the magnetization orientation of the second magnetic layer structure are oriented in opposite directions;
    wherein the magnetization orientation of the first sub-layer of the first magnetic layer structure is configured to oscillate in a first direction in response to a current or a voltage applied across the magnetic junction so as to change the magnetization orientation of the free magnetic layer structure; and
    wherein the free magnetic layer structure is adapted to function as a memory storage layer.

2. The magnetoresistive device as claimed in claim 1, wherein the magnetization orientation of the second magnetic layer structure is able to oscillate and is configured to oscillate in a second direction in response to the current or the voltage applied across the magnetic junction so as to change the magnetization orientation of the free magnetic layer structure, the second direction being opposite to the first direction.

3. The magnetoresistive device as claimed in claim 1, wherein each of the free magnetic layer structure and the second magnetic layer structure comprises at least one of iron, cobalt or nickel.

4. The magnetoresistive device as claimed in claim 1, wherein each of the free magnetic layer structure and the second magnetic layer structure comprises cobalt-iron-boron or a bilayer structure comprising a first layer of material selected from the group consisting of cobalt, cobalt-iron and cobalt-iron-boron, and a second layer of material selected from the group consisting of palladium, platinum and a combination thereof.

5. The magnetoresistive device as claimed in claim 1, wherein the first magnetic layer structure comprises:
    a ferromagnetic layer and a ferromagnetic hard layer, the ferromagnetic layer defining the first sub-layer, and the ferromagnetic hard layer defining the second sub-layer;
    wherein the ferromagnetic layer defining the first sub-layer is arranged on top of the ferromagnetic hard layer,
    wherein the ferromagnetic layer defining the first sub-layer has perpendicular anisotropy,
    wherein the magnetization orientation of the ferromagnetic layer defining the first sub-layer is configured to oscillate in the first direction in response to the current or the voltage applied across the magnetic junction; and
    wherein the ferromagnetic hard layer has in-plane anisotropy.

6. The magnetoresistive device as claimed in claim 5, wherein the first magnetic layer structure further comprises a spacer layer between the ferromagnetic layer and the ferromagnetic hard layer.

7. The magnetoresistive device as claimed in claim 6, wherein the spacer layer comprises a conductive and non-magnetic material.

8. The magnetoresistive device as claimed in claim 5, wherein the ferromagnetic hard layer comprises a synthetic antiferromagnetic layer, the synthetic antifferomagnetic layer comprising two antiferromagnetically coupled ferromagnetic layers pinned by an antiferromagnetic layer.

9. The magnetoresistive device as claimed in claim 5, wherein the first magnetic layer structure further comprises an antiferromagnetic layer arranged adjacent to the ferromagnetic hard layer.

10. The magnetoresistive device as claimed in claim 9, wherein the antiferromagnetic layer comprises a material comprising X-manganese or X-Y-manganese, wherein each of X and Y is selected from the group consisting of platinum, palladium, iridium, rhodium and ruthenium.

11. The magnetoresistive device as claimed in claim 1, wherein the first magnetic layer structure comprises:
    a first ferromagnetic layer defining the first sub-layer;
    a second ferromagnetic layer defining the second sub-layer; and
    a ferromagnetic hard layer;

wherein the first ferromagnetic layer is arranged on top of the second ferromagnetic layer, wherein the second ferromagnetic layer is arranged on top of the ferromagnetic hard layer, in between the first ferromagnetic layer and the ferromagnetic hard layer, wherein the first ferromagnetic layer and the ferromagnetic hard layer have perpendicular anisotropy, wherein the magnetization orientation of the first ferromagnetic layer is configured to oscillate in the first direction in response to the current or the voltage applied across the magnetic junction; and wherein the second ferromagnetic layer has in-plane anisotropy.

12. The magnetoresistive device as claimed in claim 11, wherein the first magnetic layer structure further comprises:
a first spacer layer between the first ferromagnetic layer and the second ferromagnetic layer; and
a second spacer layer between the second ferromagnetic layer and the ferromagnetic hard layer.

13. The magnetoresistive device as claimed in claim 12, wherein each of the first spacer layer and the second spacer layer comprises a conductive and non-magnetic material.

14. The magnetoresistive device as claimed in claim 11, wherein the first magnetic layer structure further comprises an antiferromagnetic layer arranged adjacent to the ferromagnetic hard layer.

15. The magnetoresistive device as claimed in claim 14, wherein the antiferromagnetic layer comprises a material comprising X-manganese or X-Y-manganese, wherein each of X and Y is selected from the group consisting of platinum, palladium, iridium, rhodium and ruthenium.

16. A magnetoresistive device having a magnetic junction, the magnetic junction comprising:
a first magnetic layer structure having a magnetization orientation, the first magnetic layer structure comprising a first sub-layer and a second sub-layer;
a second magnetic layer structure having a magnetization orientation; and
a free magnetic layer structure having a variable magnetization orientation;
wherein the second magnetic layer structure is arranged on top of the free magnetic layer structure,
wherein the free magnetic layer structure is arranged on top of the first magnetic layer structure, in between the first magnetic layer structure and the second magnetic layer structure,
wherein the first sub-layer of the first magnetic layer structure, the second magnetic layer structure and the free magnetic layer structure have perpendicular anisotropy;
wherein the second sub-layer of the first magnetic layer structure has in-plane anisotropy;
wherein a magnetization orientation of the first sub-layer of the first magnetic layer structure and the magnetization of the second magnetic layer structure are oriented in opposite directions;
wherein the magnetization orientation of the first sub-layer of the first magnetic layer structure is configured to oscillate in a first direction in response to a current or a voltage applied across the magnetic junction so as to change the magnetization orientation of the free magnetic layer structure; and
wherein the magnetization orientation of the second magnetic layer structure is configured to oscillate in a second direction in response to the current or the voltage applied across the magnetic junction so as to change the magnetization orientation of the free magnetic layer structure, the second direction being opposite to the first direction.

17. A magnetoresistive device having a magnetic junction, the magnetic junction comprising:
a first magnetic layer structure having a magnetization orientation, the first fixed magnetic layer structure comprising a first sub-layer and a second sub-layer;
a second magnetic layer structure having a magnetization orientation that is fixed or that is able to oscillate; and
a free magnetic layer structure having a variable magnetization orientation;
wherein the second magnetic layer structure is arranged on top of the free magnetic layer structure,
wherein the free magnetic layer structure is arranged on top of the first magnetic layer structure, in between the first magnetic layer structure and the second magnetic layer structure,
wherein the first sub-layer of the first magnetic layer structure, the second magnetic layer structure and the free magnetic layer structure have perpendicular anisotropy;
wherein the second sub-layer of the first magnetic layer structure has in-plane anisotropy;
wherein a magnetization orientation of the first sub-layer of the first magnetic layer structure and the magnetization orientation of the second magnetic layer structure are oriented in opposite directions;
wherein the magnetization orientation of the first sub-layer of the first magnetic layer structure is configured to oscillate in a first direction in response to a current or a voltage applied across the magnetic junction so as to change the magnetization orientation of the free magnetic layer structure; and
wherein the first magnetic layer structure comprises:
a ferromagnetic layer and a ferromagnetic hard layer the ferromagnetic layer defining the first sub-layer, and the ferromagnetic hard layer defining the second sub-layer;
wherein the ferromagnetic layer defining the first sub-layer is arranged on top of the ferromagnetic hard layer,
wherein the ferromagnetic layer defining the first sub-layer has perpendicular anisotropy,
wherein the magnetization orientation of the ferromagnetic layer defining the first sub-layer is configured to oscillate in the first direction in response to the current or the voltage applied across the magnetic junction; and
wherein the ferromagnetic hard layer has in-plane anisotropy.

18. A magnetoresistive device having a magnetic junction, the magnetic junction comprising:
a first magnetic layer structure having a magnetization orientation, the first magnetic layer structure comprising a first sub-layer and a second sub-layer;
a second magnetic layer structure having a magnetization orientation that is fixed or that is able to oscillate; and
a free magnetic layer structure having a variable magnetization orientation;
wherein the second magnetic layer structure is arranged on top of the free magnetic layer structure,
wherein the free magnetic layer structure is arranged on top of the first magnetic layer structure, in between the first magnetic layer structure and the second magnetic layer structure,
wherein the first sub-layer of the first magnetic layer structure, the second magnetic layer structure and the free magnetic layer structure have perpendicular anisotropy;
wherein the second sub-layer of the first magnetic layer structure has in-plane anisotropy;

wherein a magnetization orientation the first sub-layer of the first magnetic layer structure and the magnetization orientation of the second magnetic layer structure are oriented in opposite directions;

wherein the magnetization orientation of the first sub-layer of the first magnetic layer structure is configured to oscillate in a first direction in response to a current or a voltage applied across the magnetic junction so as to change the magnetization orientation of the free magnetic layer structure; and wherein the first magnetic layer structure comprises:

a first ferromagnetic layer defining the first sub-layer;

a second ferromagnetic layer defining the second sub-layer; and a ferromagnetic hard layer;

wherein the first ferromagnetic layer is arranged on top of the second ferromagnetic layer, wherein the second ferromagnetic layer is arranged on top of the ferromagnetic hard layer, in between the first ferromagnetic layer and the ferromagnetic hard layer, wherein the first ferromagnetic layer and the ferromagnetic hard layer have perpendicular anisotropy, wherein the magnetization orientation of the first ferromagnetic layer is configured to oscillate in the first direction in response to the current or the voltage applied across the magnetic junction; and wherein the second ferromagnetic layer has in-plane anisotropy.

\* \* \* \* \*